(12) United States Patent
Pitts, Jr.

(10) Patent No.: US 6,342,411 B1
(45) Date of Patent: Jan. 29, 2002

(54) ELECTRONIC COMPONENT AND METHOD FOR MANUFACTURE

(75) Inventor: Bobby L. Pitts, Jr., Tempe, AZ (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/389,638

(22) Filed: Sep. 3, 1999

(51) Int. Cl.[7] ............................................. H01L 21/338
(52) U.S. Cl. ...................... 438/173; 438/285; 438/590; 257/15; 257/20; 257/22; 257/24; 257/27; 257/76; 257/190; 257/192; 257/194; 257/201; 257/284
(58) Field of Search ............................. 251/15, 20, 22, 251/24, 27, 76, 190, 192, 194, 201, 284

(56) References Cited

U.S. PATENT DOCUMENTS 5,652,440 A * 7/1997 Chang ........................ 257/194

FOREIGN PATENT DOCUMENTS

JP            07263799     * 10/1999           H01S/3/18

* cited by examiner

*Primary Examiner*—Olik Chaudhuri
*Assistant Examiner*—Wai-Sing Louie

(57) ABSTRACT

A high voltage microwave field effect transistor (FET) and method for its manufacture. The FET (10) includes a channel layer (18) formed of compressively strained GaInP. Carrier confinement layers (16), (20) formed of tensile strained (AlGa)InP are formed both above (20) and below (16) the channel layer (20) to confine the carriers to the channel layer (20) and to provide a high breakdown voltage.

14 Claims, 1 Drawing Sheet

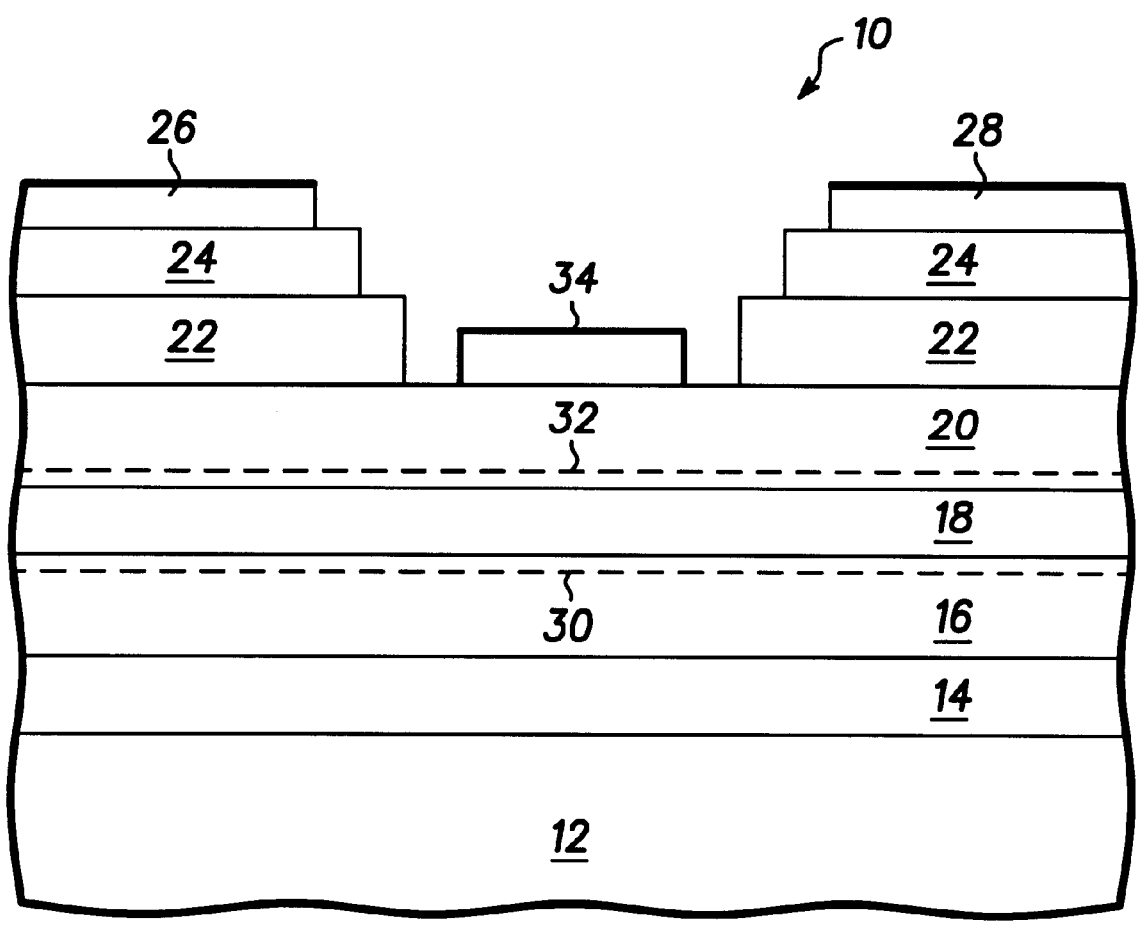

ELECTRONIC COMPONENT AND METHOD FOR MANUFACTURE

BACKGROUND OF THE INVENTION

This invention relates generally to a heterostructure device and to a method for its manufacture, and more specifically to a heterostructure field effect transistor (FET) having a high breakdown voltage and high mobility, and to a method for its manufacture.

There are many high frequency electronic applications, such as microwave power amplifiers, that require a high breakdown voltage to achieve high efficiency. Gallium arsenide (GaAs) field effect transistors, which are commonly employed for power amplifiers, typically exhibit breakdown voltages of less than 30 volts. To attain higher voltages while at the same time maintaining microwave frequency operation, it is desirable to employ alternative materials capable of sustaining higher breakdown voltages than can be obtained with GaAs. Some success has been achieved by using high field strength material such as silicon carbide (SiC) or aluminum gallium nitride (AlGaN). Devices manufactured using these materials, however, cannot be economically produced. Neither SiC nor AlGaN can be easily produced as large diameter wafers. The substrates are expensive and processing is difficult with the result that devices produced using these materials are expensive.

A need therefore exists for a transistor that can be used at microwave frequencies, that exhibits a high breakdown voltage, has a high mobility, can operate at high temperatures, and can be produced at low cost.

BRIEF DESCRIPTION OF THE DRAWINGS

The sole FIGURE illustrates, in cross-section, a heterostructure FET in accordance with one embodiment of the invention.

DETAILED DESCRIPTION OF THE DRAWINGS

The manufacture of a commercially viable, high voltage, microwave transistor requires a material having a high bandgap and a high mobility that can be processed on large diameter wafers. For comparison, GaAs, which has been successfully used for manufacturing low voltage microwave transistors, has a bandgap of 1.4 electron-volts (eV) and a mobility of about 8500 centimeter squared per volt-seconds ($cm^2/Vs$). GaAs substrates for manufacturing such devices are available in diameters up to about 15 cm. Unfortunately, with a bandgap of only 1.4 eV, breakdown voltages are limited to less than about 30 volts. Other materials such as gallium nitride (GaN) have a bandgap of 3.39 eV which will sustain breakdown voltages greater than 30 volts. GaN, however, has a mobility of only about 900 $cm^2/Vs$ and can produce devices only on sapphire or SiC substrates. Such substrates are very expensive and are available only in small diameters.

In accordance with the invention, it has been discovered that high voltage microwave electronic components such as heterostructure field effect transistors can be economically implemented by using certain strain compensated III-V materials. In accordance with the preferred embodiment of the invention, successful high voltage microwave transistors can be implemented using strain compensated aluminum gallium indium phosphide ((AlGa)InP) and strain compensated gallium indium phosphide (GaInP).

The various aspects and embodiments of the invention can be understood by reference to the sole figure and the following description. The sole figure schematically illustrates, in a simplified cross-sectional view, a single field effect transistor 10 in accordance with one embodiment of the invention. In accordance with a preferred embodiment, microwave transistor 10 is fabricated on a semi-insulating substrate 12. Preferably the semi-insulating substrate is a single crystal GaAs substrate. As those of skill in the art will recognize, a plurality of such transistors can be simultaneously fabricated on a single substrate. For purposes of illustrating the invention, however, the fabrication of only a single device is illustrated.

The device is fabricated on semi-insulating substrate 12 by the sequential growth or deposition of a number of epitaxial layers. These layers can be grown or deposited by molecular beam epitaxy (MBE), metal organic chemical vapor deposition (MOCVD), or other appropriate mechanisms. These processes and the attendant cleaning and other preparation steps necessary to implement these processes are well known and will not be described further. The deposition is usually done sequentially in a single reactor with appropriate changes in reactants to produce the required layers.

The semi-insulating substrate is prepared for the deposition of the active device regions by the deposition thereon of a lattice match buffer layer 14. The buffer layer provides a surface upon which high quality crystalline layers can be subsequently grown. In accordance with one embodiment of the invention, the buffer layer is a layer of indium gallium phosphide (InGaP) having a thickness in the range of 100–200 nanometers (nm). The thickness of this layer is not critical; thicknesses in the range of 100–200 nm have been found to provide effective buffer layers. In accordance with a further embodiment of the invention, the buffer layer can be an AlAs/GaAs super lattice. In such a super lattice, layers of aluminum arsenide (AlAs) and GaAs are alternated. Each layer has a thickness of about 2.5 nm, and the total super lattice buffer layer has a thickness in the range of 25–50 nm. Buffer layer 14, formed in accordance with either embodiment, is also semi-insulating and thus forms part of the semi-insulating substrate.

Following formation of the buffer layer, three layers 16, 18, 20 are sequentially deposited. Each of these layers suitably comprises a wide bandgap III-V material. In accordance with a preferred embodiment, layers 16 and 20 are (AlGa)InP, and layer 18 is GaInP. In the completed device, GaInP layer 18 forms the conductive channel of the FET. The (AlGa)InP layers serve to confine the current conducting carriers to the channel layer. Because of the higher mobility of electrons, these devices are usually fabricated as n-channel devices, and the invention will hereinafter be described in terms of an n-channel embodiment. It will be appreciated that, p-channel devices can also be manufactured in the same manner by using appropriate changes in dopants. Thus, for an n-channel FET, layers 16 and 20 provide for electron confinement in the channel layer 18.

In accordance with the preferred embodiment of the invention, channel layer 18 is formed of compressive strained GaInP, and channel carrier containment layer 20 is formed of tensile strained (AlGa)InP. In a particularly preferred embodiment of the invention, channel carrier confinement layer 16 is also formed from tensile strained (AlGa)InP.

One objective, in accordance with the invention, is to provide a high frequency device capable of high breakdown voltage. Unintentionally doped GaInP has a room temperature electron mobility of about 3000 $cm^2/Vs$. Such a high electron mobility can yield field effect devices in the microwave range. Additionally, unintentionally doped GaInP has a bandgap of about 1.91 eV. By compressively straining the GaInP in channel layer 18 and by tensile straining the (AlGa)InP in layer 20, and preferably also in layer 16, conduction band offsets in the range of 0.2 eV can be achieved. In addition, (AlGa)InP has a bandgap range of 1.9–2.3 eV. The high bandgap in the strained layers results in a high electric field strength and thus in a high breakdown voltage. Additionally, the high bandgap of the tensile strained (AlGa)InP layer 20 provides a high Schottky barrier so that an effective gate electrode can be formed on the surface of layer 20.

The GaInP channel region 18 can be deposited as a compressively strained layer by making the material indium (In) rich with respect to lattice matched InGaP during the deposition process. It should be understood that an indium rich material has a mole fraction of indium phosphide greater than 49 percent. The composition of the GaInP layer can be expressed more precisely as $Ga_zIn_{1-z}P$. In lattice matched condition, z=0.51. The lattice becomes compressive strained as z is reduced below 0.51. In accordance with the preferred embodiment of the invention, the GaInP layer is deposited with z in the range from about 0.30 to about 0.51. By way of example, z is approximately 0.40. In forming layer 20, and optionally layer 16, in accordance with a preferred embodiment of the invention, the (AlGa)InP layer is deposited in a tensile strained condition. The composition of the (AlGa)InP layer is more precisely expressed by $(Al_xGa_{1-x})_yIn_{1-y}P$. In the lattice matched condition, x=0.5 and y=0.51. As the aluminum (AlGa) in the composition increases, the layer is tensile strained, and the bandgap increases. In accordance with the preferred embodiment of the invention, x is reduced to a value in the range of about 0.3, and y is increased to a value greater than about 0.51. Preferably y is adjusted to a value in the range of about 0.60 during the deposition of the (AlGa)InP layer.

Compression straining the channel layer 18 and tensile straining conductor confining layer 20 (and preferably also conductor confining layer 16) produce a conduction band offset that effectively confines the majority carriers (electrons for an n-channel FET) within the channel layer. Viewed in energy space, the conduction band offset produces a well in which the majority carriers are confined between the confining layers 16 and 20.

For the tensile strained layer the resulting lattice is smaller than the host lattice. That is, in the preferred embodiment, the aluminum gallium (AlGa) rich (AlGa)InP lattice is smaller than the lattice matched (AlGa)InP. The more AlGa rich the layer becomes, the more strain that is induced and the thinner the layer must be in order to maintain a high crystallinity in the layer. It should be understood that an aluminum gallium rich material has a mole fraction of aluminum gallium phosphide greater than 51 percent. The maximum thickness that can be tolerated, for a given concentration of AlGa, can be extended if the adjacent layer is made compressive. Thus by juxtapositioning a compressive layer between two tensile layers, the thickness of each layer can be increased. Increasing the thickness of the layers provides more flexibility over many of the device parameters such as mobility, threshold voltage, and in some designs, a thicker channel layer can improve the current carrying capability of the device.

In the preferred embodiment, device 10 further includes a layer 22 of lattice matched GaInP. This layer improves the breakdown voltage of the device by providing a layer into which the depletion region can spread, lowering the critical field.

The heterostructure transistor 10, in accordance with the invention, further includes, in the preferred embodiment, a heavily doped GaAs layer 24. This layer is ultimately used to provide a good contact, preferably an ohmic contact, to source and drain electrodes 26 and 28, respectively.

Layers 14, 16, 18, 20, 22, and 24 are preferably deposited sequentially in a deposition reactor by making appropriate changes in the reactants to deposit the various layers. In a preferred embodiment layer, 16 has a thickness in the range of about 20 nm, channel layer 18 has a thickness in the range of about 15 nm, layer 20 has a thickness in the range of about 20 nm, layer 22 has a thickness in the range of about 10 nm and GaAs layer 24 has a thickness in the range of about 30 nm. During the deposition of the layers, dopant is provided to supply carriers in the channel region. In accordance with one embodiment of the invention, the required doping is provided during the deposition process by providing a delta doping sheet indicated by the dashed line 30. Alternatively, a dopant for the channel can be provided as a delta doping sheet in layer 20 as indicated by the dashed line 32. And yet a further embodiment of the invention, the delta doping can be provided in both layer 16 and layer 20. The delta doping sheet suitably comprises a thin layer of a high concentration of dopant (hence the name delta taken from the Dirac delta function) that is located within about 3–5 nm of the interface between channel layer 18 and either one of confinement layers 16 or 20. The delta doping layer may comprise a layer of silicon atoms or tellurium atoms as n-type dopants or, alternatively, carbon or beryllium as p-type dopants. In accordance with yet another embodiment of the invention, the channel doping can be provided by directly doping channel layer 18. In accordance with this embodiment, preferably the channel layer is doped to a concentration of about $10^{17}$ to $5 \times 10^{18}$ $cm^{-3}$.

After the deposition of layer 24, the processing of device 10 continues by photo lithographically patterning and etching first layer 24 and then layer 22. The photo lithographic patterning and etching may be performed in a conventional manner. Layer 24 is patterned to form source and drain contact regions. Layer 22 is patterned to define a channel region of the FET. A Schottky barrier gate 34 is formed by depositing and patterning an appropriate metal. Appropriate metals for the Schottky barrier gate on (AlGa)InP include titanium platinum gold (TiPtAu), tungsten silicide (WSi), and titanium tungsten nitride (TiWN). In a similar manner, source and drain electrodes 26 and 28 are formed on the remaining portion of layer 24 by depositing and patterning a metal which forms a contact, preferably an ohmic contact, to the GaAs material. A preferred metal for such a contact electrode is nickel germanium gold (NiGeAu).

Thus it is apparent that there has been provided, in accordance with the invention, a high voltage, high frequency transistor that fully meets the needs expressed above. The device can be manufactured on inexpensive substrates using conventional processing techniques. Although the heterostructure device and method for its fabrication have been described and illustrated with reference to specific embodiments thereof, it is not intended that the invention be limited to these illustrative embodiments. For example, those of skill in the art will recognize that the thickness of the various layers can be modified to accommodate various device requirements. Accordingly, it is intended that all such variations and modifications which fall within the true spirit and scope of the invention be included within the appended claims.

What is claimed is:

1. A method for manufacturing a field effect transistor comprising the steps of:

providing a substrate;

depositing a first layer of (AlGa)InP overlying the substrate;

depositing a second layer of compressive strained GaInP overlying the first layer and forming a first interface therewith, wherein said second layer is a channel layer;

depositing a third layer of tensile strained (AlGa)InP overlying the second layer and forming a second interface therewith; and forming a remainder of the field effect transistor, wherein the field effect transistor has an increased breakdown voltage due to straining of the second and third layers.

2. The method of claim 1 further comprising the step of providing a delta doping layer in the first layer near the first interface during the deposition of the first layer.

3. The method of claim 1 further comprising the step of providing a delta doping layer in the third layer near the second interface during the deposition of the third layer.

4. The method of claim 1 further comprising the step of impurity doping the second layer during the deposition thereof.

5. The method of claim 1 wherein the steps of depositing a first layer and a third layer comprise depositing AlGa rich (AlGa)InP layers.

6. The method of claim 1 wherein the step of depositing a second layer comprises depositing an In rich GaInP layer.

7. The method of claim 1 further comprising the step of depositing a lattice matched fourth layer of GaInP overlying the third layer.

8. The method of claim 7 further comprising the step of depositing a layer of doped contact material overlying the fourth layer.

9. The method of claim 8 further comprising the step of forming source and drain contacts on the doped contact material.

10. The method of claim 7 further comprising the step of forming a gate electrode overlying the third layer.

11. A method for manufacturing a field effect transistor comprising the steps of:

providing a semi-insulating substrate;

depositing a first carrier confinement layer formed of a wide bandgap III-V material overlying the semi-insulating substrate;

depositing a compressive strained channel layer of the field effect transistor of wide bandgap III-V material overlying the first carrier confinement layer;

depositing a tensile strained second carrier confinement layer formed of a wide bandgap III-V material overlying the channel layer of the field effect transistor; and forming a remainder of the field effect transistor.

12. The method of claim 11 wherein the field effect transistor has an increased breakdown voltage due to straining.

13. The method of claim 11 wherein the step of depositing a tensile strained second carrier confinement layer comprises depositing a layer of AlGa rich (AlGa)InP.

14. The method of claim 11 wherein the step of depositing a compressive strained channel layer comprises depositing a layer of In rich GaInP.

* * * * *